US 6,496,347 B1

(12) United States Patent
Christensen et al.

(10) Patent No.: US 6,496,347 B1
(45) Date of Patent: Dec. 17, 2002

(54) SYSTEM AND METHOD FOR OPTIMIZATION OF A CIRCUIT BREAKER MECHANISM (75) Inventors: Dave S. Christensen, Harwinton, CT (US); Randall L. Greenberg, Granby, CT (US); Roger Castonguay, Terryville, CT (US); Thomas Papallo, Farmington, CT (US); Steve L. Mecker, Fort Wayne, IN (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/521,137

(22) Filed: Mar. 8, 2000

(51) Int. Cl.[7] .................................. H01H 73/00
(52) U.S. Cl. ...................... 361/115; 361/78; 361/93.1
(58) Field of Search .................. 361/115, 78, 87, 361/93.1

(56) References Cited

U.S. PATENT DOCUMENTS

| 2,340,682 A | 2/1944 | Powell .................... 200/147 |
| 2,719,203 A | 9/1955 | Gelzheiser et al. ......... 200/144 |
| 2,937,254 A | 5/1960 | Ericson .................... 200/114 |
| 3,158,717 A | 11/1964 | Jencks et al. ............... 200/116 |
| 3,162,739 A | 12/1964 | Klein et al. ................ 200/88 |
| 3,197,582 A | 7/1965 | Norden .................... 200/50 |
| 3,307,002 A | 2/1967 | Cooper .................... 200/116 |
| 3,517,356 A | 6/1970 | Hanafusa ................... 335/16 |
| 3,631,369 A | 12/1971 | Menocal ................... 337/110 |
| 3,803,455 A | 4/1974 | Willard ................... 317/33 SC |
| 3,883,781 A | 5/1975 | Cotton ..................... 317/14 R |
| 4,129,762 A | 12/1978 | Bruchet ................... 200/153 G |
| 4,144,513 A | 3/1979 | Shafer et al. ............... 335/46 |
| 4,158,119 A | 6/1979 | Krakik .................... 200/240 |
| 4,165,453 A | 8/1979 | Hennermann ............. 200/153 G |
| 4,166,988 A | 9/1979 | Ciarcia et al. ............... 335/9 |
| 4,220,934 A | 9/1980 | Wafer et al. ................. 335/16 |
| 4,255,732 A | 3/1981 | Wafer et al. ................. 335/16 |
| 4,259,651 A | 3/1981 | Yamat ..................... 335/16 |
| 4,263,492 A | 4/1981 | Maier et al. ................ 200/288 |
| 4,276,527 A | 6/1981 | Gerbert-Gaillard et al. .... 335/39 |
| 4,297,663 A | 10/1981 | Seymour et al. .............. 335/20 |
| 4,301,342 A | 11/1981 | Castonguay et al. .... 200/153 SC |
| 4,360,852 A | 11/1982 | Gilmore .................... 361/98 |
| 4,368,144 A | 1/1983 | Preuss et al. ................ 335/166 |
| 4,375,021 A | 2/1983 | Pardini et al. ............. 200/147 B |
| 4,375,022 A | 2/1983 | Daussin et al. ........... 200/148 R |
| 4,376,270 A | 3/1983 | Staffen .................... 335/21 |
| 4,383,146 A | 5/1983 | Bur ......................... 200/17 R |
| 4,392,036 A | 7/1983 | Troebel et al. .............. 200/322 |
| 4,393,283 A | 7/1983 | Masuda .................... 200/51.09 |
| 4,401,872 A | 8/1983 | Boichot-Castagne et al. .... 200/153 G |
| 4,409,573 A | 10/1983 | DiMarco et al. .............. 335/16 |
| 4,435,690 A | 3/1984 | Link et al. .................. 335/37 |
| 4,467,297 A | 8/1984 | Boichot-Castagne et al. ... 335/8 |
| 4,468,645 A | 8/1984 | Gerbert-Gaillard et al. .... 335/42 |

(List continued on next page.)

FOREIGN PATENT DOCUMENTS

BE  819 008 A  12/1974
BE  897 691 A  1/1984

(List continued on next page.)

Primary Examiner—Stephen W. Jackson
(74) Attorney, Agent, or Firm—Cantor Colburn LLP (57) ABSTRACT

A system that implements a design process having a plurality of sub-processes each having a plurality of sub-steps. The system includes an independent application for implementing the design process. A series of independent sub-process applications each implements one sub-process of the design process. A communications path provides for communications between the design process and each of the sub-process applications. The communications path also provides for communications between each of said plurality of sub-processes. An application library containing a plurality of executable applications is accessible by the design process and sub-processes to access and execute the plurality of application tools.

23 Claims, 5 Drawing Sheets

U.S. PATENT DOCUMENTS

| | | | | |
|---|---|---|---|---|
| 4,470,027 | A | 9/1984 | Link et al. | 335/16 |
| 4,479,143 | A | 10/1984 | Watanabe et al. | 358/44 |
| 4,488,173 | A | 12/1984 | McClellan et al. | 335/16 |
| 4,492,941 | A | 1/1985 | Nagel | 335/13 |
| 4,541,032 | A | 9/1985 | Schwab | 361/331 |
| 4,546,224 | A | 10/1985 | Mostosi | 200/153 G |
| 4,550,360 | A | 10/1985 | Dougherty | 361/93 |
| 4,562,419 | A | 12/1985 | Preuss et al. | 335/195 |
| 4,589,052 | A | 5/1986 | Dougherty | 361/94 |
| 4,595,812 | A | 6/1986 | Tamaru et al. | 200/307 |
| 4,611,187 | A | 9/1986 | Banfi | 335/16 |
| 4,612,430 | A | 9/1986 | Sloan et al. | 200/327 |
| 4,616,198 | A | 10/1986 | Pardini | 335/16 |
| 4,622,444 | A | 11/1986 | Kandatsu et al. | 200/303 |
| 4,631,625 | A | 12/1986 | Alexander et al. | 361/94 |
| 4,642,431 | A | 2/1987 | Tedesco et al. | 200/153 G |
| 4,644,438 | A | 2/1987 | Puccinelli et al. | 361/75 |
| 4,649,247 | A | 3/1987 | Preuss et al. | 200/244 |
| 4,658,322 | A | 4/1987 | Rivera | 361/37 |
| 4,672,501 | A | 6/1987 | Bilac et al. | 361/96 |
| 4,675,481 | A | 6/1987 | Markowski et al. | 200/144 R |
| 4,682,264 | A | 7/1987 | Demeyer | 361/96 |
| 4,689,712 | A | 8/1987 | Demeyer | 361/96 |
| 4,694,373 | A | 9/1987 | Demeyer | 361/96 |
| 4,710,845 | A | 12/1987 | Demeyer | 361/96 |
| 4,717,985 | A | 1/1988 | Demeyer | 361/96 |
| 4,733,211 | A | 3/1988 | Castonguay et al. | 335/192 |
| 4,733,321 | A | 3/1988 | Lindeperg | 361/96 |
| 4,764,650 | A | 8/1988 | Bur et al. | 200/153 G |
| 4,768,007 | A | 8/1988 | Mertz et al. | 335/202 |
| 4,780,786 | A | 10/1988 | Weynachter et al. | 361/87 |
| 4,831,221 | A | 5/1989 | Yu et al. | 200/553 |
| 4,870,531 | A | 9/1989 | Danek | 361/93 |
| 4,883,931 | A | 11/1989 | Batteux et al. | 200/148 R |
| 4,884,047 | A | 11/1989 | Baginski et al. | 335/10 |
| 4,884,164 | A | 11/1989 | Dziura et al. | 361/97 |
| 4,900,882 | A | 2/1990 | Bernard et al. | 200/147 R |
| 4,910,485 | A | 3/1990 | Bolongeat-Mobleu et al. | 335/195 |
| 4,914,541 | A | 4/1990 | Tripodi et al. | 361/94 |
| 4,916,420 | A | 4/1990 | Bartolo et al. | 335/172 |
| 4,916,421 | A | 4/1990 | Pardini et al. | 335/185 |
| 4,926,282 | A | 5/1990 | McGhie | 361/102 |
| 4,935,590 | A | 6/1990 | Malkin et al. | 200/148 A |
| 4,937,706 | A | 6/1990 | Schueller et al. | 361/396 |
| 4,939,492 | A | 7/1990 | Raso et al. | 335/42 |
| 4,943,691 | A | 7/1990 | Mertz et al. | 200/151 |
| 4,943,888 | A | 7/1990 | Jacob et al. | 361/96 |
| 4,950,855 | A | 8/1990 | Bolonegeat-Mobleu et al. | 200/148 A |
| 4,951,019 | A | 8/1990 | Gula | 335/166 |
| 4,952,897 | A | 8/1990 | Barnel et al. | 335/147 |
| 4,958,135 | A | 9/1990 | Baginski et al. | 335/8 |
| 4,965,543 | A | 10/1990 | Batteux | 335/174 |
| 4,983,788 | A | 1/1991 | Pardini | 200/16 R |
| 5,001,313 | A | 3/1991 | Leclerq et al. | 200/148 B |
| 5,004,878 | A | 4/1991 | Seymour et al. | 200/144 R |
| 5,029,301 | A | 7/1991 | Nebon et al. | 335/16 |
| 5,030,804 | A | 7/1991 | Abri | 200/323 |
| 5,057,655 | A | 10/1991 | Kersusan et al. | 200/148 B |
| 5,077,627 | A | 12/1991 | Fraisse | 361/93 |
| 5,083,081 | A | 1/1992 | Barrault et al. | 324/126 |
| 5,095,183 | A | 3/1992 | Raphard et al. | 200/148 A |
| 5,103,198 | A | 4/1992 | Morel et al. | 335/6 |
| 5,115,371 | A | 5/1992 | Tripodi | 361/106 |
| 5,120,921 | A | 6/1992 | DiMarco et al. | 200/401 |
| 5,132,865 | A | 7/1992 | Mertz et al. | 361/6 |
| 5,138,121 | A | 8/1992 | Streich et al. | 200/293 |
| 5,140,115 | A | 8/1992 | Morris | 200/308 |
| 5,153,802 | A | 10/1992 | Mertz et al. | 361/18 |
| 5,155,315 | A | 10/1992 | Malkin et al. | 200/148 R |
| 5,166,483 | A | 11/1992 | Kersusan et al. | 200/144 A |
| 5,172,087 | A | 12/1992 | Castonguay et al. | 335/160 |
| 5,178,504 | A | 1/1993 | Falchi | 411/553 |
| 5,184,717 | A | 2/1993 | Chou et al. | 200/401 |
| 5,187,339 | A | 2/1993 | Lissandrin | 200/148 F |
| 5,198,956 | A | 3/1993 | Dvorak | 361/106 |
| 5,200,724 | A | 4/1993 | Gula et al. | 335/166 |
| 5,210,385 | A | 5/1993 | Morel et al. | 200/146 R |
| 5,239,150 | A | 8/1993 | Bolongeat-Mobleu et al. | 200/148 R |
| 5,260,533 | A | 11/1993 | Livesey et al. | 200/401 |
| 5,262,744 | A | 11/1993 | Arnold et al. | 335/8 |
| 5,280,144 | A | 1/1994 | Bolongeat-Mobleu et al. | 200/148 R |
| 5,281,776 | A | 1/1994 | Morel et al. | 200/144 |
| 5,296,660 | A | 3/1994 | Morel et al. | 200/146 R |
| 5,296,664 | A | 3/1994 | Crookston et al. | 200/401 |
| 5,298,874 | A | 3/1994 | Morel et al. | 335/8 |
| 5,300,907 | A | 4/1994 | Nereau et al. | 335/172 |
| 5,310,971 | A | 5/1994 | Vial et al. | 200/244 |
| 5,313,180 | A | 5/1994 | Vial et al. | 335/16 |
| 5,317,471 | A | 5/1994 | Izoard et al. | 361/105 |
| 5,331,500 | A | 7/1994 | Corcoles et al. | 361/93 |
| 5,334,808 | A | 8/1994 | Bur et al. | 200/50 |
| 5,341,191 | A | 8/1994 | Crookston et al. | 335/16 |
| 5,347,096 | A | 9/1994 | Bolongeat-Mobleu et al. | 200/148 B |
| 5,347,097 | A | 9/1994 | Bolongeat-Mobleu et al. | 200/148 B |
| 5,350,892 | A | 9/1994 | Rozier | 200/144 B |
| 5,357,066 | A | 10/1994 | Morel et al. | 200/17 R |
| 5,357,068 | A | 10/1994 | Rozier | 200/148 R |
| 5,357,394 | A | 10/1994 | Piney | 361/72 |
| 5,361,052 | A | 11/1994 | Ferullo et al. | 335/172 |
| 5,373,130 | A | 12/1994 | Barrault et al. | 200/147 R |
| 5,379,013 | A | 1/1995 | Coudert | 335/17 |
| 5,424,701 | A | 6/1995 | Castonguary et al. | 335/172 |
| 5,438,176 | A | 8/1995 | Bonnardel et al. | 200/400 |
| 5,440,088 | A | 8/1995 | Coudert et al. | 200/303 |
| 5,449,871 | A | 9/1995 | Batteux et al. | 200/401 |
| 5,450,048 | A | 9/1995 | Leger et al. | 335/132 |
| 5,451,729 | A | 9/1995 | Onderka et al. | 200/18 |
| 5,457,295 | A | 10/1995 | Tanibe et al. | 200/293 |
| 5,467,069 | A | 11/1995 | Payet-Burin et al. | 335/42 |
| 5,469,121 | A | 11/1995 | Payet-Burin | 335/16 |
| 5,475,558 | A | 12/1995 | Barjonnet et al. | 361/64 |
| 5,477,016 | A | 12/1995 | Baginski et al. | 200/43.11 |
| 5,479,143 | A | 12/1995 | Payet-Burin | 335/202 |
| 5,483,212 | A | 1/1996 | Lankuttis et al. | 335/132 |
| 5,485,343 | A | 1/1996 | Santos et al. | 361/115 |
| D367,265 | S | 2/1996 | Yamagata et al. | D13/160 |
| 5,493,083 | A | 2/1996 | Olivier | 200/17 R |
| 5,504,284 | A | 4/1996 | Lazareth et al. | 200/50 R |
| 5,504,290 | A | 4/1996 | Baginski et al. | 200/401 |
| 5,510,761 | A | 4/1996 | Boder et al. | 335/172 |
| 5,512,720 | A | 4/1996 | Coudert et al. | 200/400 |
| 5,515,018 | A | 5/1996 | DiMarco et al. | 335/16 |
| 5,519,561 | A | 5/1996 | Mrenna et al. | 361/105 |
| 5,534,674 | A | 7/1996 | Steffens | 218/154 |
| 5,534,832 | A | 7/1996 | Duchemin et al. | 335/16 |
| 5,534,835 | A | 7/1996 | McColloch et al. | 335/172 |
| 5,534,840 | A | 7/1996 | Cuingnet | 337/1 |
| 5,539,168 | A | 7/1996 | Linzenich | 200/303 |
| 5,543,595 | A | 8/1996 | Mader et al. | 200/401 |
| 5,552,755 | A | 9/1996 | Fello et al. | 335/18 |
| 5,581,219 | A | 12/1996 | Nozawa et al. | 335/132 |
| 5,604,656 | A | 2/1997 | Derrick et al. | 361/187 |
| 5,608,367 | A | 3/1997 | Zoller et al. | 335/132 |
| 5,777,841 | A * | 7/1998 | Stone et al. | 364/554 |
| 5,784,233 | A | 7/1998 | Bastard et al. | 361/36 |

6,253,115 B1 * 6/2001 Martin et al. .................. 700/97

FOREIGN PATENT DOCUMENTS

| | | |
|---|---|---|
| DE | 12 27 978 | 11/1966 |
| DE | 30 47 360 | 6/1982 |
| DE | 38 02 184 | 8/1989 |
| DE | 38 43 277 | 6/1990 |
| DE | 44 19 240 | 1/1995 |
| EP | 0 061 092 | 9/1982 |
| EP | 0 064 906 | 11/1982 |
| EP | 0 066 486 | 12/1982 |
| EP | 0 076 719 | 4/1983 |
| EP | 0 117 094 | 8/1984 |
| EP | 0 140 761 | 5/1985 |
| EP | 0 174 904 | 3/1986 |
| EP | 0 196 241 | 10/1986 |
| EP | 0 224 396 | 6/1987 |
| EP | 0 235 479 | 9/1987 |
| EP | 0 239 460 | 9/1987 |
| EP | 0 258 090 | 3/1988 |
| EP | 0 264 313 | 4/1988 |
| EP | 0 264 314 | 4/1988 |
| EP | 0 283 189 | 9/1988 |
| EP | 0 283 358 | 9/1988 |
| EP | 0 291 374 | 11/1988 |
| EP | 0 295 155 | 12/1988 |
| EP | 0 295 158 | 12/1988 |
| EP | 0 309 923 | 4/1989 |
| EP | 0 313 106 | 4/1989 |
| EP | 0 313 422 | 4/1989 |
| EP | 0 314 540 | 5/1989 |
| EP | 0 331 586 | 9/1989 |
| EP | 0 337 900 | 10/1989 |
| EP | 0 342 133 | 11/1989 |
| EP | 0 367 690 | 5/1990 |
| EP | 0 371 887 | 6/1990 |
| EP | 0 375 568 | 6/1990 |
| EP | 0 394 144 | 10/1990 |
| EP | 0 394 922 | 10/1990 |
| EP | 0 399 282 | 11/1990 |
| EP | 0 407 310 | 1/1991 |
| EP | 0 452 230 | 10/1991 |
| EP | 0 555 158 | 8/1993 |
| EP | 0 560 697 | 9/1993 |
| EP | 0 567 416 | 10/1993 |
| EP | 0 595 730 | 5/1994 |
| EP | 0 619 591 | 10/1994 |
| EP | 0 665 569 | 8/1995 |
| EP | 0 700 140 | 3/1996 |
| EP | 0 889 498 | 1/1999 |
| FR | 2 410 353 | 6/1979 |
| FR | 2 512 582 | 3/1983 |
| FR | 2 553 943 | 4/1985 |
| FR | 2 592 998 | 7/1987 |
| FR | 2 682 531 | 4/1993 |
| FR | 2 697 670 | 5/1994 |
| FR | 2 699 324 | 6/1994 |
| FR | 2 714 771 | 7/1995 |
| GB | 2 233 155 | 1/1991 |
| RU | 1 227 978 | 4/1986 |
| WO | 92/00598 | 1/1992 |
| WO | 92/05649 | 4/1992 |
| WO | 94/00901 | 1/1994 |

* cited by examiner

Design of Experiment Process

FIG. 5

SYSTEM AND METHOD FOR OPTIMIZATION OF A CIRCUIT BREAKER MECHANISM

BACKGROUND OF THE INVENTION

The invention relates to a system for implementing a design for six sigma (DFSS) process. For any application (business, manufacturing, service, etc.), the sigma value is used to indicate variability. A sigma quality level indicates how well a process is performing. The higher the sigma value, the better the output. Sigma measures the capability of the process to perform defect-free-work, wherein a defect is synonymous with customer dissatisfaction. With six sigma the common measurement index is defects-per-unit where a unit can be virtually anything—a component, a piece part of a jet engine, an administrative procedure, etc. The sigma value indicates how often defects are likely to occur. As sigma increases, customer satisfaction goes up along with improvement of other metrics (e.g., cost and cycle time).

The six sigma methodology has been implemented for specific applications such as semiconductor manufacturing. However, a drawback to these specific applications is that there is a lack of flexibility to allow for the existing implementation to be applied to other applications, such as the manufacturing of a product having multiple operations, each of which affects the performance of another operation.

Moreover, the performance of such operations are sometimes customer sensitive and the performance of one operation is sometimes improved at the expense of the performance of another operation.

BRIEF SUMMARY OF THE INVENTION

An exemplary embodiment of the invention is a system for implementing a design for six sigma process having a plurality of sub-processes each having a plurality of sub-steps. The system includes an independent main application for implementing the design for six sigma process. A series of independent sub-process applications each implements one sub-process of the design for six sigma process.

DETAILED DESCRIPTION OF THE INVENTION

Using six-Sigma techniques, a series of transfer functions are developed for a circuit breaker mechanism under different modes of operation. These series of equations are then solved simultaneously to provide an optimal circuit breaker mechanism design.

Circuit breaker mechanisms are operated in several different modes. For example, on/off, off/on, trip and reset are just a few of the operational modes anticipated for a circuit breaker mechanism. In designing the mechanism, the engineer has to balance the many different customer requirements to achieve the desired performance.

Many times these requirements are contradictory, for example, if the customer requires a high withstand rating, but still desires low handle forces, one of the ways to increase the withstand force in a circuit breaker mechanism is to increase the contact pressure, however, this requires a stronger mechanism spring which in turn increases the circuit breaker handle forces. Thus, and in order to increase the withstand rating (a desired outcome) the required closing force is increased (an undesired outcome).

Accordingly, and in order to meet one of the customer's desired performances, the other one of the customer's requirements may not be met. Therefore, and in order to provide an optimal design, the operational parameters of each interdependent function must be so simultaneously.

Figure 1:
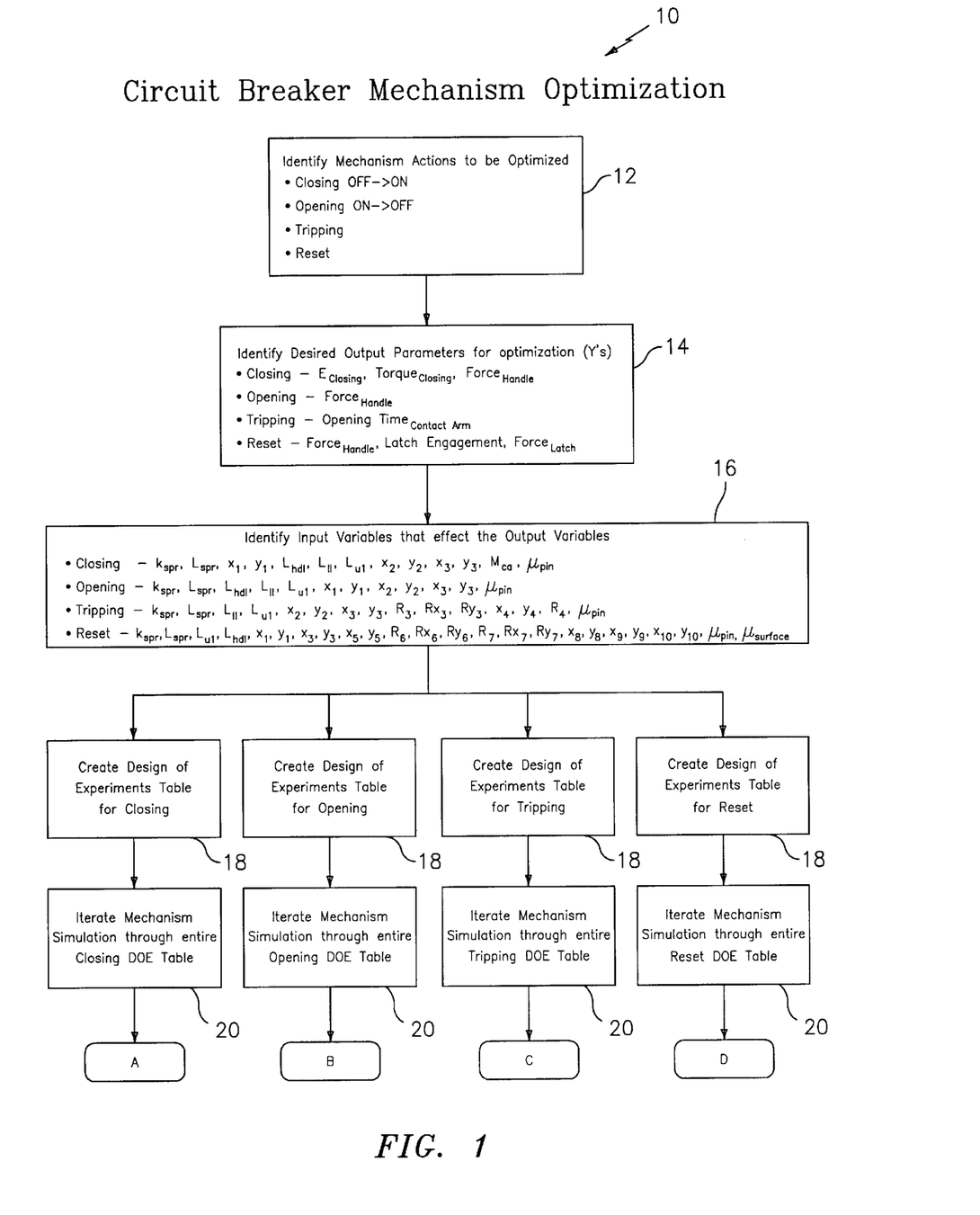
FIGS. 1 and 2 are a flowchart illustrating the circuit breaker mechanism optimization process that may be implemented by the present invention.

Referring now to FIG. 1, a flowchart 10 illustrates the optimization process of the instant application. In an exemplary embodiment, a first step 12 identifies the mechanism actions which are to be optimized by the process of the instant application.

In an exemplary embodiment, step 12 identifies four actions to be optimized, 1) circuit breaker mechanism closing from an off position to an on position, 2) circuit breaker mechanism opening from an on position to an off position, 3) circuit breaker tripping function and 4) circuit breaker reset function. Of course, and as an application may require, is contemplated that the number of actions to be optimized may vary.

A second step 14 identifies desired output parameters of each action to be optimized.

For example, the output parameters for closing are $E_{closing}$, $Torque_{closing}$ and $Force_{handle}$. For opening, the desired parameters are $Force_{handle}$ and for Tripping the desired parameters are Opening $Time_{contact\ arm}$. For Reset the desired parameters are $Force_{handle}$ and Latch Engagement $Force_{latch}$. Accordingly, the desired value for each of these output parameters must be determined.

A third step 16 identifies the input variables that will affect the output variables of step 14. Again, the input variables for Closing, Opening, Tripping and Reset are identified. Based upon this information a plurality of steps 18 create Design of Experiment (DOE) tables for Closing, Opening, Tripping and Reset respectively.

Once completed, another plurality of steps 20 performs a mechanism simulation through the values of the entire Design of Experiment table corresponding to closing, opening, tripping and reset.

Figure 2:
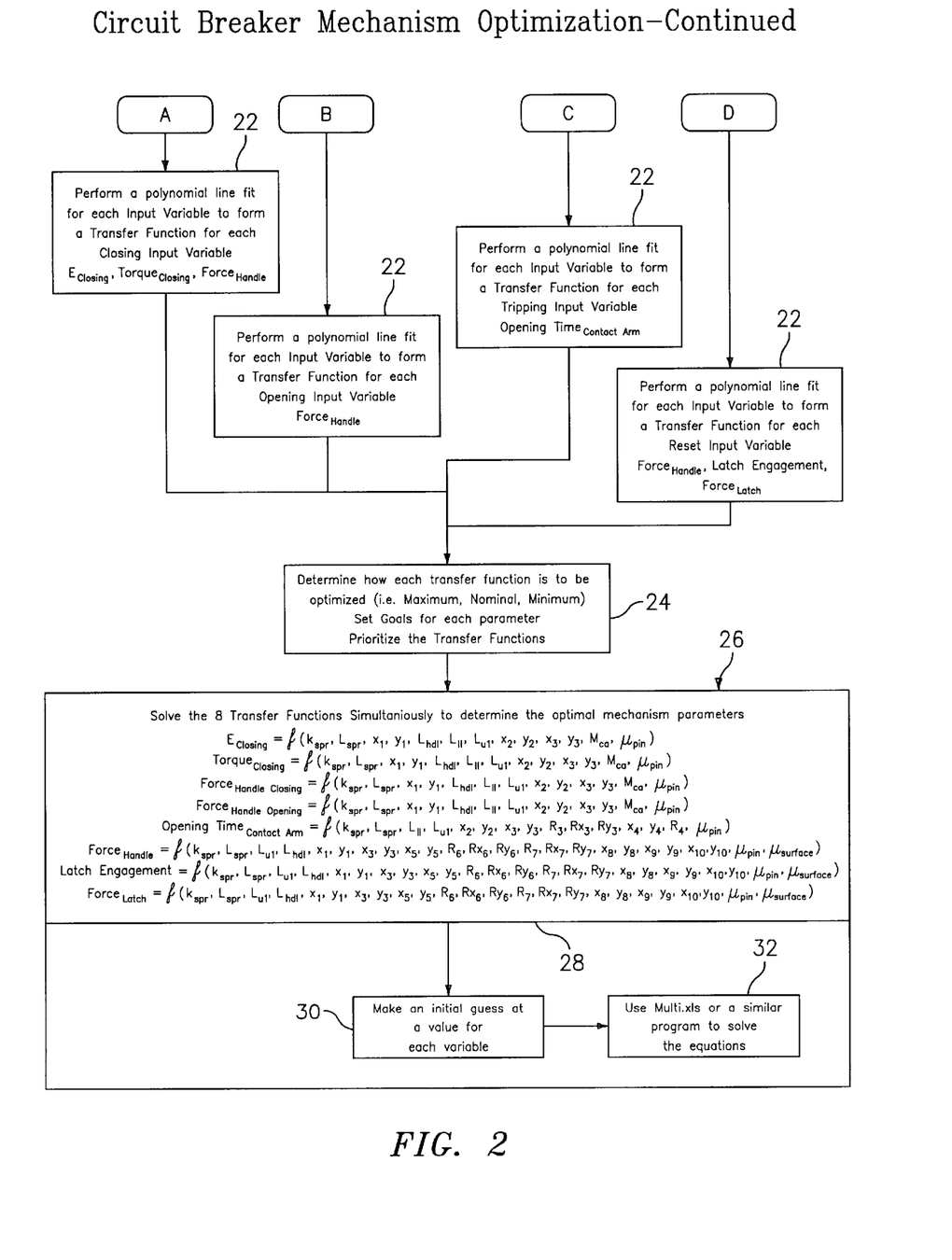

A plurality steps 22 each performs a polynomial fit for each input variable (step 16) to form a transfer function for each Closing, Opening, Tripping and Reset input variables. The results of each step 22 is inputted into a step 24 which determines how each transfer function is to be optimized (i.e. maximum, nominal and minimum). In addition, goals are set for each parameter and the transfer functions are prioritized.

A step 26 solves all of the transfer functions simultaneously to determine the optimal mechanism parameters. Step 26 includes sub-steps 28–32. Step 28 solves the transfer functions simultaneously. Once completed, an initial guess for each variable is made by step 30 and a final step 32 uses a computer algorithm or program such as Multi.xls or a similar program to solve the equations.

Final step 32 now provides the performance of a circuit breaker mechanism design in accordance with the desired output parameters identified in step 14. This output is now analyzed for compliance with a desired range and if acceptable, the process is repeated.

The analysis process of the instant application involved a multidimensional optimization problem characterization and solution offering process for parameters of certain circuit breaker mechanisms. Such parameters include, and are not limited to the following: handle forces; closing energy; torque; latch force; contact arm velocity; and trip time. These parameters were identified as CTQs or critical to quality. The inherent qualities and interdependency of these CTQ's requires simultaneous optimization of the CTQs in order to provide an ideal final design.

In an exemplary embodiment, a series of analytical full factorial design of experiments (DOEs) with parameters affecting each of the CTQs is performed utilizing a dynamic simulator software package Working Model. In an exemplary embodiment, there are six CTQs. Of course, it is contemplated that the method of the instant application may be applied to applications other than circuit breaker designs having a higher or lower amount of CTQs.

The resulting analysis of variance (ANOVA) produced six transfer functions which are then simplified to "reduced models" which incorporate only the larger magnitude sensitivity coefficients.

These six equations were then optimized to target values via the multiple response optimization tool MULTIR.xls. Accordingly, various possible local optimal solutions were translated from coated values to natural (actual) values for use in design specifications.

The output parameters are defined for each mode (opening, closing, tripping and reset), steps 12 and 14. The variables, which affect these parameters, are determined for each output (step 16) and a series of screening DOE's are performed to eliminate any variables (steps 18–22) that are not significant to the output parameter. Once the variables are finalized, a full factorial simulation DOE is performed for each mechanism operation mode. The use of DOE techniques is particularly important as it takes into consideration the second and third (occasional fourth) order interactions between the variables.

For purposes of this design, a script was written that allowed communication between the dynamic simulator and a DOE table in Excel. The values were pulled from the Excel table, the simulation was run, and the outputs were automatically transferred back to Excel. In this fashion, a large number of DOE runs were executed in an automated fashion.

The data generated from the DOE's is analyzed using a statistical analysis such as Minitab to determine the transfer function coefficients. Once the transfer functions were generated, variability of each parameter can be determined using Monte Carlo techniques. The final equations are then solved.

Figure 3:
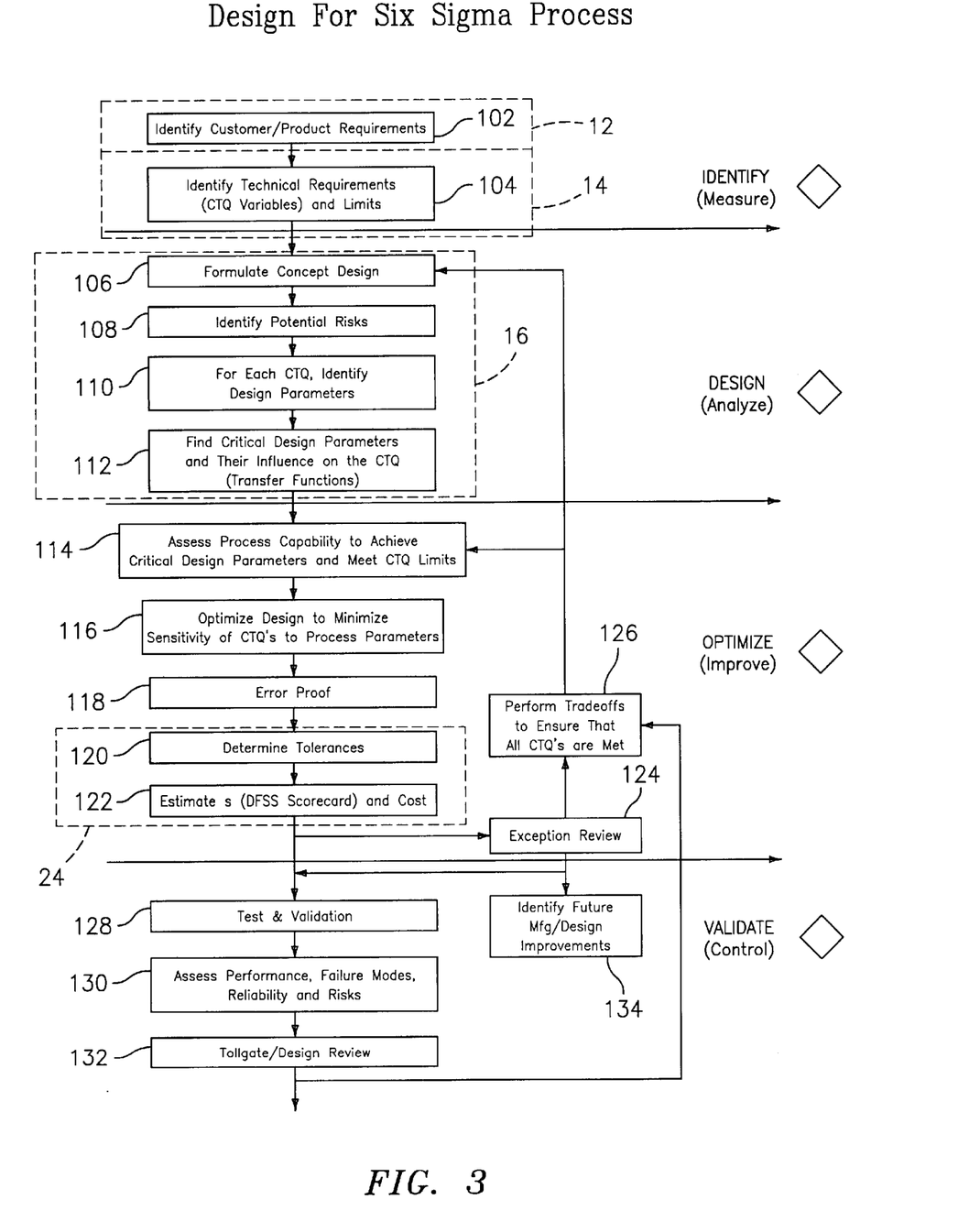
FIG. 3 is a block diagram of the system for implementing a design for six sigma process.

Referring now to FIG. 3, a flowchart 100 illustrates a design for six sigma (DFSS) process that may be implemented using an exemplary embodiment of the instant application.

The overall DFSS process of FIG. 3 can be divided into four sub-processes indicated as Identify, Design, Optimize and Validate. Each sub-process utilizes a plurality of sub-steps. The Identify sub-process includes sub-steps 102 and 104 which are entitled identify customer/product requirements and identify technical requirements (CTQ variables) and limits, respectively. These sub-processes relate to steps 12 and 14 of FIG. 1.

The Design sub-process includes sub-steps 106–112, which are entitled: Formulate Concept Design; Identify Potential Risks; For Each CTQ, Identify Design Parameters; and Find Critical Design Parameters and Their Influence on the CTQ (Transfer Functions), respectively. These sub-steps relate to step 16 of FIG. 1.

The Optimize sub-process includes sub-steps 114–126. Steps 120 and 122 relate to step 24 of FIG. 2.

The Validate sub-process includes sub-steps 128–134, which relate to steps 18, 20, 22 and 26–32 of FIGS. 1 and 2. The DFSS process shown in FIG. 3 is useful for improving the process of designing a product or procedure. The invention can also be applied to other six sigma processes such as the Measure, Analyze, Improve and Control (MAIC) process used for improving processes (such as manufacturing processes or business processes). The invention is a system for implementing a design for six sigma process and may be used with other six sigma processes or similar processes.

Figure 4:
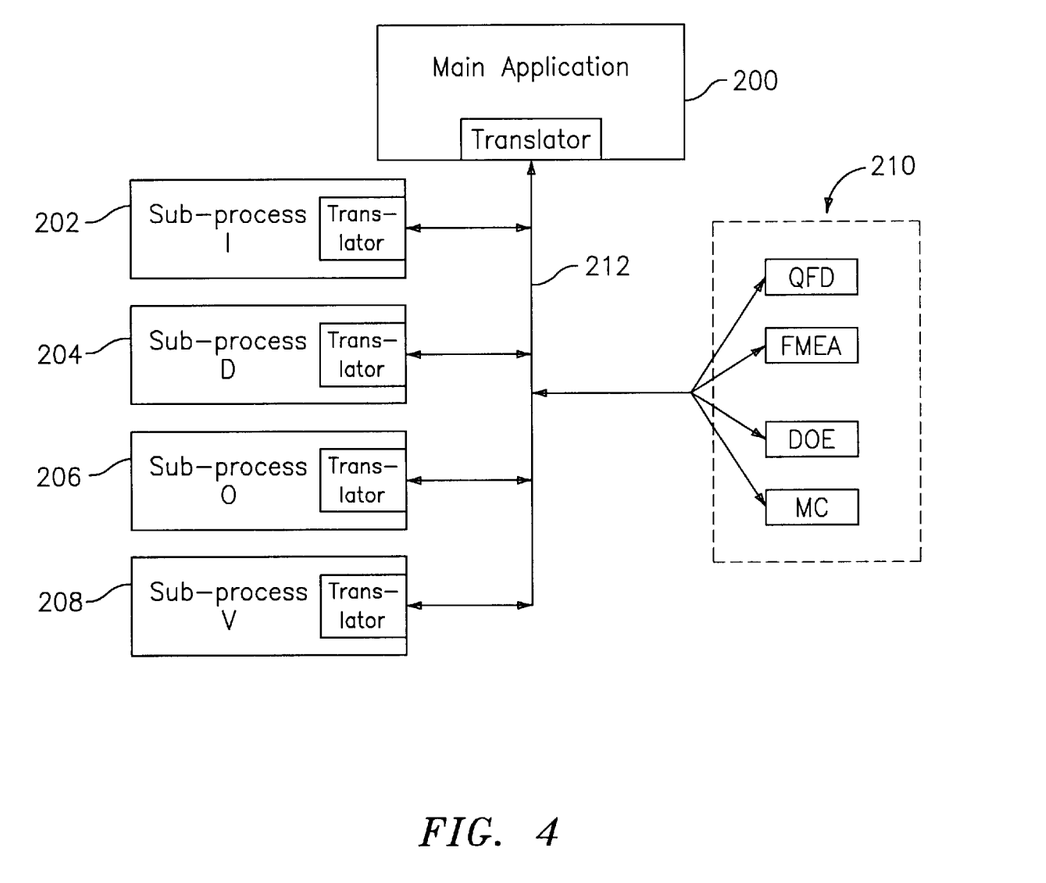
FIG. 4 is a block diagram of a system utilizing the design for six sigma process illustrated in FIG. 3.

FIG. 4 is a block diagram of a system for implementing a DFSS process in an exemplary embodiment of the invention. To implement the DFSS process in a generic manner, a number of stand-alone applications 200, 202, 204, 206 and 208 are used. Each application is independent and can be executed or modified without interaction with other applications. Each application can be saved independently and re-used and can communicate with other applications over a communication path 212. As will be described in more detail below, each application also has access (via communication path 212) to a plurality of tools stored in a tool library 210.

Main application 200 controls implementation of the overall DFSS process shown in FIGS. 1–3 The main process application 200 can launch each of the sub-process applications 202, 204, 206 and 208. The Identify sub-process application 202 implements steps 102–104 shown in FIGS. 1–3. The Design sub-process application 204 implements steps 106–112 shown in FIGS. 1–3. The Optimize sub-process application 206 implements steps 114–126 shown in FIGS. 1–3. The Validate sub-process application 208 implements steps 128–134 shown in FIGS. 1–3. The main process application 200 and the sub-process applications 202–208 are designed to communicate with each other over communication path 212. The main application 200 and sub-process applications 202–208 can also access tools in tool library 210 over communications path 212. The communications path 212 interconnects all the components of the system and allows the user to independently access only the portions that are needed for a particular task. Tools in tool library 210 can also access other tools through communications path 212. It is understood that FIG. 4 is an exemplary embodiment and other configurations may be used. For example, the number and types of stand-alone applications may be varied.

The main process application 200 and each sub-process application 202–208 can access and execute tools contained in a tool library 210. Tool library 210 contains a variety of tools useful in implementing the DFSS process. Tool library 210 includes common engineering tools such as ANSYS (finite element tool), Minitab (general-purpose statistical tool), Working Model (general purpose rigid-body dynamic simulator) and Saber (electrical/electronic tool), as well as statistical tools and methods such as Quality Function Deployment (QFD), Failure Mode and Effect Analysis (FMEA), Design of Experiments (DOE), Monte-Carlo (MC) and many other tools. The QFD tool helps the user select critical-to-quality (CTQ) variables. The FMEA tool allows the user to perform a failure mode and effect analysis to identify major problems and risks associated with a given design. Each application also includes an automatic experimentation capability that allows the user to enter data in either a manual mode or an automatic mode. The automatic mode allows for easy integration of various engineering tools and also allows the user to automate repetitive processes and tasks.

Figure 5:
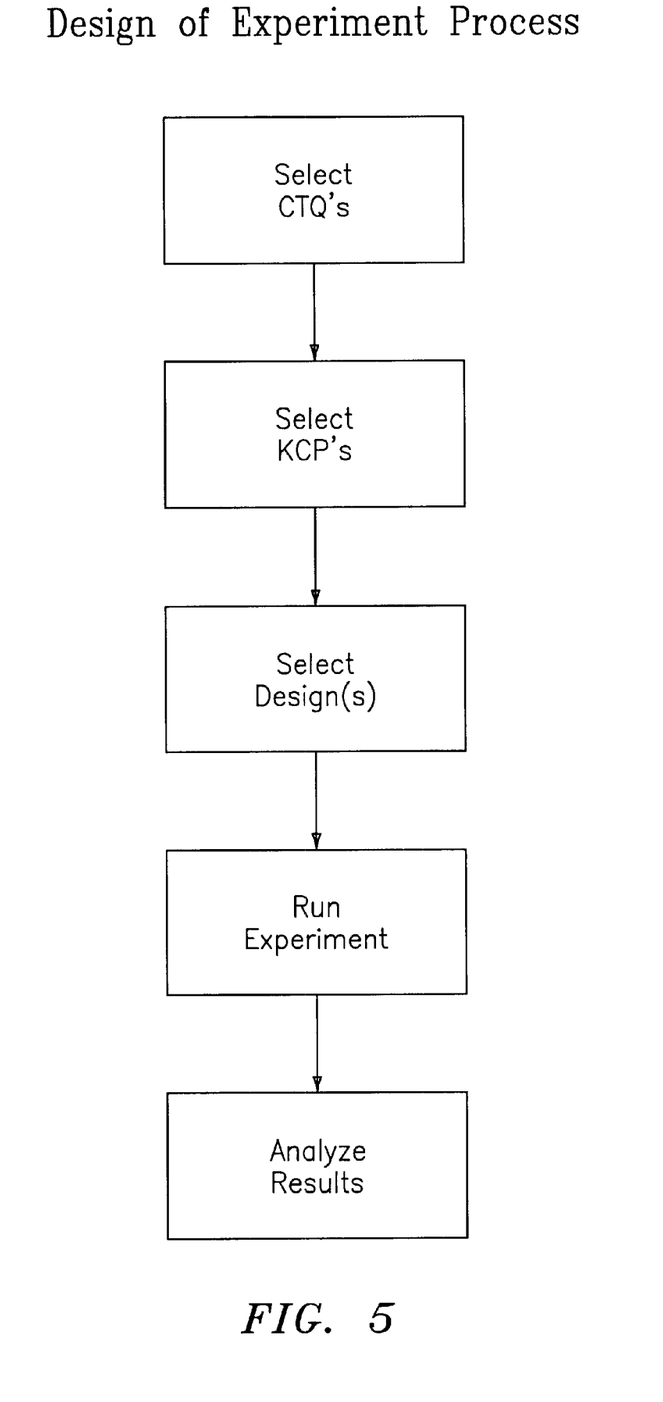
FIG. 5 is a block diagram of a design of experiment process.

FIG. 5 illustrates the DOE process. The DOE tool can be launched, for example, from step 110 of FIG. 3 to screen design parameters or from step 114. Accordingly, an individual executes one of the applications 200–208 and accesses the DOE tool in tool library 210. FIG. 5 shows the DOE process. A first step selects the critical to quality (CTQ) parameters. The CTQs identify features of the product that should be present in order to meet customer requirements. A number of key control parameters (KCPs) are identified as having an effect on CTQs. The designs are then selected and the experiments are run. The results are analyzed and the process is repeated until a satisfactory result is obtained. The DOE process is itself a process, and can have sub-processes, sub-steps, etc. It can also have access to other tools in tool library 210 via communications path 212. Other tools in the tool library 210 may have similar characteristics. Other tools in the tool library are accessed and executed in a similar fashion.

The tool library 210 may also contain custom tools developed by a user or group of users including quality function deployment tools, design generation tools for generating experimental designs, response surface tools for generating transfer functions, optimization tools for optimizing processes and scorecards for defect per unit calculation.

The DOE tool and or process is enhanced by including access to custom designs generated by a particular user. The tools can be customized for a particular user for example, the DOE tool is enhanced by including access to custom designs generated by a particular user (FIGS. 1 and 2). Additional advantages of the DOE tool include access to a Microsoft access database (containing 300+experimental designs) and designs for large number of parameters. Moreover, the database provides access to special purpose designs such as mixed level and optimal designs (e.g. D-optimal).

Tools for advanced regression techniques may also be included in tool library 210. These techniques help users determine transfer functions by providing automatic detection for confounding, a search algorithm for maximum $R^2$ (or adjusted $R^2$ or any other similar statistic or measure of the quality of fit).

To allow for communication with a variety of tools, each application 200–208 has a translator that allows it to communicate and execute various external tools (commercial applications such as ANSYS, Saber, Excel, etc.). The translator provides a standard communications interface to the application that enables other components of the system to access functions of that particular application in a standardized manner. In addition, the Java programming language and platform are used to implement each application 200–208. The object oriented programming (OOP) approach used in the Java programming language allows for easy implementation of the DFSS process. The portability of the Java programming language to various platforms (PC, UNIX, etc.) allows the software to operate under different operating systems. The whole process is modeled in the form of an OOP data structure for easy implementation. A graphical user interface (GUI) is also implemented in the Java programming language in order to allow each application to communicate with other tools such as engineering tools and statistical tools. Communication with Microsoft object linking and embedding (OLE) and with dynamic data exchange (DDE) is provided via the Java programming language to OLE and DDE servers. For example, and as in the present invention, DDE was used in a script to exchange data between the spreadsheet and the dynamic simulator. The system has an open architecture allowing users to write their own translators. Thus, other communications methods (other than OLE, etc.) can be supported by the system.

Each application 200–208 used to implement the DFSS process has two main components. A first component of the application is a structured design that models processes and methods. The second component of the application is an unstructured design that serves as a documentation area for designers to document their processes and methods by entering notes, comments, etc. The information in the documentation area may be archived for future reference. Each application may also include an advisor to help the user make educated choices and judgments. Each application may include a database that documents information relevant to the application.

The present invention provides a generic implementation of DFSS process. The generic nature of the invention makes it easily adaptable to other engineering and quality processes such as systems engineering, tolerance analysis, etc. The use of object oriented programming and translators allows each application to communicate over a variety of platforms with a variety of tools.

The present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for optimizing a circuit breaker mechanism, comprising:
    an application for identifying a plurality of output parameters of said circuit breaker mechanism, said output parameters being identified as candidates for optimization;

an application for identifying a plurality of input variables whose value affects the value of said plurality of output parameters;

an application for implementing a design of experiments table for each of said input variables, said design of experiments table generating a plurality of output values;

an application utilizing each of said plurality of output values and generating a series of values comparable to said plurality of output parameters; and an application for comparing said series of values to said plurality of output parameters, said application determining whether said series of values are within predetermined tolerances.

2. The system as in claim 1, wherein said plurality of output parameters affect the performance of the following circuit breaker actions:

i) the closing action of a circuit breaker;

ii) the opening action of a circuit breaker;

iii) the tripping action of a circuit breaker; and iv) the reset action of a circuit breaker.

3. The system has in claim 2, wherein said plurality of output parameters affect the value of said plurality of output parameters.

4. The system as in claim 1, further comprising:

f) an application for defining a range for each output parameter.

5. The system as in claim 4, wherein said range includes a maximum, nominal and minimal value for each output parameter.

6. A method for optimizing a circuit breaker mechanism, comprising:

identifying a plurality of functions of said circuit breaker mechanism, said functions being identified as candidates for optimization;

identifying a plurality of input variables whose value affects the value of said plurality of functions;

implementing a design of experiments table for each of said input variables, said design of experiments table generating a plurality of output values;

utilizing each of said plurality of output values and generating a series of values comparable to said plurality of said functions; and comparing said series of values to said plurality of functions; and determining whether said series of values are within a plurality of predetermined tolerances.

7. The method as in claim 6, wherein said plurality of predetermined tolerances includes a maximum, nominal and minimal value.

8. The method as in claim 7, wherein said series of values are within said predetermined tolerances when said series of values are closest to said nominal value.

9. A system for implementing a design process having a plurality of sub-processes each having a plurality of sub-steps, said system comprising:

a) an independent application for implementing a design process;

b) a plurality of independent sub-process applications, each implementing one sub-process of the design process;

c) an application library containing a plurality of executable applications, said design process and said sub-process applications are configured to access and execute said plurality of executable applications; and d) a communications path for interconnecting said design process, said sub-process applications and said application library.

10. A system for optimizing a circuit breaker mechanism, comprising:

an application for identifying a plurality of actions of said circuit breaker mechanism, said actions being identified as candidates for optimization;

an application for defining a plurality of desired output parameters for each of said plurality of actions;

an application for identifying a plurality of input variables for each of said plurality of output parameters, wherein said input variables affect at least one of said plurality of output parameters;

an application for creating a design of experiments table for each of said plurality of actions;

an application for performing a simulation corresponding to each of said plurality of actions;

an application for developing a transfer function for each of said plurality of input variables;

an application for optimizing said transfer functions; and an application for simultaneously solving said transfer functions.

11. A system as in claim 10, wherein said actions comprise:

a first action corresponding to the closing action of a circuit breaker;

a second action corresponding to the opening action of a circuit breaker;

a third action corresponding to the tripping action of a circuit breaker; and a fourth action corresponding to the reset action of a circuit breaker.

12. A system as in claim 10, further comprising an application for transferring a first plurality of values from said table to said simulation and for transferring a second plurality of values from said simulation to said table.

13. A system as in claim 10 or 12, wherein said simulation is a full factorial simulation.

14. A system as in claim 10, wherein said transfer function is developed by performing a polynomial line fit for each said input variable.

15. A system as in claim 10, wherein said table is developed using at least one spreadsheet application.

16. A method for optimizing a circuit breaker mechanism, comprising:

identifying a plurality of actions of said circuit breaker mechanism, said actions being identified as candidates for optimization;

defining a plurality of desired output parameters for each of said plurality of actions;

identifying a plurality of input variables for each of said plurality of output parameters, wherein said input variables affect at least one of said plurality of output parameters;

creating a design of experiments table for each of said plurality of actions;

performing a simulation corresponding to each of said plurality of actions;

developing a transfer function for each of said plurality of input variables;

optimizing said transfer functions; and simultaneously solving said transfer functions.

17. A method as in claim 16, wherein said actions comprise:
- a first action corresponding to the closing action of a circuit breaker;
- a second action corresponding to the opening action of a circuit breaker;
- a third action corresponding to the tripping action of a circuit breaker; and
- a fourth action corresponding to the reset action of a circuit breaker.

18. A method as in claim 16, wherein said simulation receives a first plurality of values from said table corresponding to said operation, further wherein said table receives a second plurality of values from said simulation.

19. A method as in claim 16 or 18, wherein said simulation is a full factorial simulation.

20. A method as in claim 16, wherein said transfer function is developed by performing a polynomial line fit for each said input variable.

21. A method as in claim 16, wherein said table is developed using at least one spreadsheet application.

22. A system for optimizing a circuit breaker mechanism, comprising:
- an application for identifying a plurality of output parameters of said circuit breaker mechanism, said output parameters being identified as candidates for optimization;
- an application for identifying a plurality of input variables whose value affects the value of said plurality of output parameters;
- an application for implementing a design of experiments table for each of said actions, said design of experiments table generating a plurality of output values;
- an application utilizing each of said plurality of output values and generating a series of values comparable to said plurality of output parameters; and
- an application for comparing said series of values to said plurality of output parameters, said application determining whether said series of values are within predetermined tolerances.

23. A method for optimizing a circuit breaker mechanism, comprising:
- identifying a plurality of functions of said circuit breaker mechanism, said functions being identified as candidates for optimization;
- identifying a plurality of input variables whose value affects the value of said plurality of functions;
- implementing a design of experiments table for each of said actions, said design of experiments table generating a plurality of output values;
- utilizing each of said plurality of output values and generating a series of values comparable to said plurality of said functions; and
- comparing said series of values to said plurality of functions; and
- determining whether said series of values are within a plurality of predetermined tolerances.

* * * * *